United States Patent
Kim

(10) Patent No.: US 8,193,088 B2
(45) Date of Patent: Jun. 5, 2012

(54) METHOD OF FORMING METAL LINES OF SEMICONDUCTOR DEVICE

(75) Inventor: Suk Joong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/977,681

(22) Filed: Dec. 23, 2010

(65) Prior Publication Data
US 2012/0040527 A1 Feb. 16, 2012

(30) Foreign Application Priority Data
Aug. 10, 2010 (KR) .................. 10-2010-0076826

(51) Int. Cl.
*H01L 21/4763* (2006.01)
*H01L 21/44* (2006.01)

(52) U.S. Cl. ........ 438/637; 438/640; 438/675; 438/795; 257/E21.577; 257/E21.578; 257/E21.585

(58) Field of Classification Search .......... 438/637, 438/640, 675, 795; 257/E21.577, E21.578, 257/E21.585
See application file for complete search history.

(56) References Cited

U.S. PATENT DOCUMENTS
6,528,368 B1 * 3/2003 Park ................... 438/253
2011/0108994 A1 * 5/2011 Liang et al. ............. 257/774

FOREIGN PATENT DOCUMENTS
KR 1020020075065 10/2002
KR 1020050064328 6/2005

OTHER PUBLICATIONS
Notice of Preliminary Rejection issued from Korean Intellectual Property Office on Aug. 19, 2011.

* cited by examiner

*Primary Examiner* — Hsien Ming Lee
(74) *Attorney, Agent, or Firm* — IP & T Group LLP

(57) ABSTRACT

A method of forming metal lines of a semiconductor device includes forming an etch stop layer over a semiconductor substrate over which underlying structures are formed, forming an insulating layer over the etch stop layer, etching the etch stop layer and the insulating layer to form trenches through which the underlying structures are exposed, shrinking the insulating layer by using a thermal treatment process in order to widen openings of the trenches, and filling the trenches with a conductive material.

15 Claims, 5 Drawing Sheets

METHOD OF FORMING METAL LINES OF SEMICONDUCTOR DEVICE

CROSS-REFERENCE TO RELATED APPLICATION

Priority to Korean patent application number 10-2010-0076826 filed on Aug. 10, 2010, the entire disclosure of which is incorporated by reference herein, is claimed.

BACKGROUND

Exemplary embodiments relate to a method of forming the metal lines of a semiconductor device and, more particularly, to a method of forming the metal lines of a semiconductor device, which is capable of improving a phenomenon in which a void is generated in the metal lines.

A semiconductor device includes conductive patterns stacked in multiple layers. The conductive patterns of the same layer may be formed within trenches, contact holes, or recess regions formed in an insulating layer and electrically isolated from each other. Furthermore, the conductive patterns of different layers may be electrically isolated from each other by an insulating layer or electrically coupled to each other through contact plugs. In a case where the conductive patterns of the semiconductor device are formed by using a damascene scheme, a driving failure may occur in the semiconductor device because of a void.

Hereinafter, the occurrence of a void in a process of forming the conductive patterns of a semiconductor device is described in detail with reference to FIG. 1. FIG. 1 shows an example of a process of forming the metal lines of a NAND flash memory device.

Referring to FIG. 1, in the NAND flash memory device including a plurality of cell strings, a plurality of insulating layers 5a, 5b may be stacked over the drain regions (not shown) of a cell string. Each of the drain regions is coupled to drain contact plugs 7 penetrating the insulating layers 5a, 5b formed over the drain regions. The drain contact plugs 7 may be formed by forming drain contact holes by removing the insulating layers 5a, 5b using an etch process to expose the drain regions, and then filling the drain contact holes with a conductive material.

Next, an etch stop layer 9 and an insulating layer 11 are formed over the insulating layer 5b including the drain contact plugs 7. Next, a plurality of trenches 15 are formed by removing the insulating layer 11 and the etch stop layer 9 formed over the drain contact plugs 7 to expose the drain contact plugs 7. Each of the trenches 15 is formed to expose a corresponding drain contact plug 7. However, with an increase of the degree of integration of semiconductor devices, a gap between the drain contact plugs 7 is narrowed, and so overlay margin between the drain contact plug 7 and a corresponding trench 15 becomes insufficient. If the drain contact plugs 7 and the trenches 15 are not properly arranged because of the shortage of overlay margin between the drain contact plugs 7 and the trenches 15, a problem may arise because neighboring drain contact plugs 7 are exposed through one trench 15. In this case, if bit lines are formed within the trenches 15 in a subsequent process, neighboring bit lines may be interconnected by the drain contact plug 7, resulting in a bridge between the bit lines. In order to prevent such a bridge, the trenches 15 are formed to have a reduced critical dimension (CD).

Next, in order to form metal lines, such as the bit lines, within the trenches 15, the trenches 15 are filled with a conductive material 17. However, since the critical dimension (CD) of the trenches 15 has been reduced in order to secure overlay margin, the aspect ratio of the trenches 15 has been increased. If the conductive material 17 is deposited to fill the trenches 15 in the state in which the aspect ratio of the trenches 15 has been increased as described above, the conductive material 17 is deposited thicker at the entrance of the trench 15 than on the sidewalk towards bottom of the trench 15. It leads to an overhang structure in which the width of the opened region at the entrance of the trench 15 is narrower than the width of the opened region towards the bottom of the trench 15. Consequently, before the trench 15 is fully filled with the conductive material 17, the entrance of the trench 15 is blocked by the conductive material 17, and so a void 19 may be formed within the trench 15. In this case, the bit lines may be disconnected, resulting in an operation failure of the semiconductor device. In particular, in a case where copper (Cu) is used as the conductive material 17 and deposited by using an electroplating method in order to improve resistance of the bit lines, barrier metal for preventing the diffusion of copper (Cu) and a seed layer for plating copper (Cu) is formed by using a chemical vapor deposition (CVD) method before forming a copper (Cu) layer. If the conductive material 17 is deposited by using a chemical vapor deposition (CVD) method as described above, an overhang structure is likely to occur. This makes it more difficult to fill the trenches 15 with the conductive material 17.

BRIEF SUMMARY

Exemplary embodiments relate to a method of forming metal lines of a semiconductor device, which is capable of preventing the occurrence of a void in the metal lines.

An exemplary method of forming the metal lines of a semiconductor device according to an aspect of the present disclosure includes forming an etch stop layer over a semiconductor substrate over which underlying structures are formed, forming an insulating layer over the etch stop layer, etching the etch stop layer and the insulating layer to form trenches through which the underlying structures are exposed, shrinking the insulating layer by using a thermal treatment process in order to widen openings of the trenches, and filling the trenches with a conductive material.

The insulating layer is preferably formed by depositing an oxide layer at a temperature lower than a temperature of the thermal treatment process.

The insulating layer may be formed of a high density plasma (HDP) oxide layer or a polysilazane (PSZ) layer. The etch stop layer may be formed of a nitride layer.

Another exemplary method of forming the metal lines of a semiconductor device according to another aspect of this disclosure includes forming a first insulating layer over a semiconductor substrate over which underlying structures are formed, forming a second insulating layer over the first insulating layer at a temperature higher than a temperature when the first insulating layer is formed, forming a trench in the second insulating layer and the first insulating layer, shrinking the second insulating layer by performing a thermal treatment process in order to widen a width of an opening of the trench, and filling the trench with a conductive material.

The insulating layer is preferably formed by depositing an oxide layer at a temperature lower than a temperature of the thermal treatment process.

The first and second insulating layers may be formed of a high density plasma (HDP) oxide layer or a polysilazane (PSZ) layer.

The first insulating layer may be formed by depositing an oxide layer at a temperature higher than a temperature of the thermal treatment process.

The thermal treatment process may be performed at a temperature of 400° C. The thermal treatment process may be performed by using a furnace or heating with plasma.

The underlying structures may include an impurity implantation region formed in the semiconductor substrate, at least one layer of an interlayer dielectric layer formed over the semiconductor substrate and formed to have a contact hole to expose the impurity implantation region, and a contact plug formed within the contact hole. The contact plug may be exposed through the trench.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

FIGS. 2A to 2D are cross-sectional views illustrating a method of forming metal lines of a semiconductor device according to a first exemplary embodiment of this disclosure.

Figure 1:
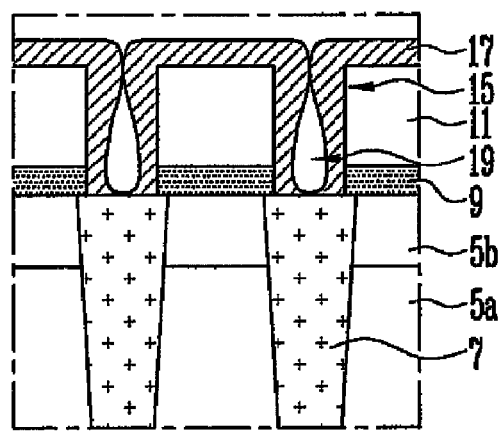
FIG. 1 is a diagram illustrating the occurrence of a void in a process of forming metal lines of a semiconductor device.
Figure 2A:
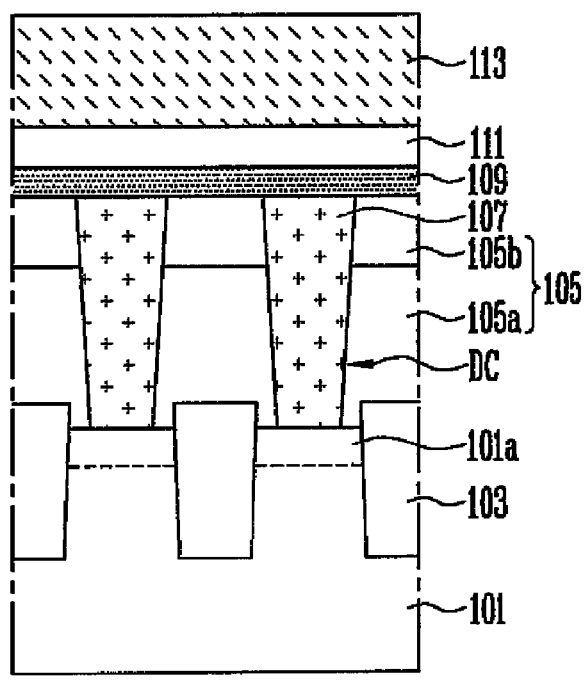
FIGS. 2A to 2D are cross-sectional views illustrating a method of forming metal lines of a semiconductor device according to a first exemplary embodiment of this disclosure.

Referring to FIG. 2A, an etch stop layer 109 is formed over a semiconductor substrate 101 over which underlying structures 101a, 103, 105, and 107 are formed. A first insulating layer 111 is formed over the etch stop layer 109, and a second insulating layer 113 is formed over the first insulating layer 111.

In the case of a NAND flash memory device, the underlying structures 101a, 103, 105, and 107 may include isolation layers 103, gate patterns (not shown), impurity implantation regions 101a, at least one layer of an interlayer dielectric layer 105, contact holes DC, and contact plugs 107. The isolation layers 103 are formed to separate the active regions of the semiconductor substrate 101. The isolation layers 103 may be formed by etching the semiconductor substrate 101 and then filling portions from which the semiconductor substrate 101 has been removed with an insulating material. Although not shown, the gate patterns are formed over the semiconductor substrate 101 and configured to include the gates of memory cells, the gates of drain select transistors, and the gates of source select transistors, constituting strings of a NAND flash memory device. The impurity implantation regions 101a may be formed by implanting impurities into the active regions of the semiconductor substrate 101 by using the gate patterns as a mask. Here, the impurity implantation region 101a formed between the gates of the drain select transistors is also used as the drain of the string. The at least one layer of the interlayer dielectric layer 105 may include first interlayer dielectric layers 105a, formed to define regions in which source lines (not shown) may be formed, and second interlayer dielectric layers 105b, formed over the first interlayer dielectric layers 105a and formed to electrically insulate the source lines. The source lines are electrically coupled to the source regions between the source select transistors used as the sources of the strings. In FIG. 2A, the contact holes DC are shown as, for example, drain contact holes formed to expose the impurity implantation regions 101a defined as the drains. The contact holes DC may be formed by removing the interlayer dielectric layer 105 over the impurity implantation regions 101a. In FIG. 2A, the contact plugs 107 are shown as, for example, drain contact plugs electrically coupled to the impurity implantation regions 101a used as the drains. The contact plugs 107 may be formed by filling the contact holes DC with a conductive material.

The etch stop layer 109 may be formed of a nitride layer. In order to prevent the first insulating layer 111 from shrinking under the influence of a subsequent thermal process, the first insulating layer 111 is preferably deposited in a temperature range that is higher than a temperature range of the subsequent thermal process. In contrast, the second insulating layer 113 is preferably deposited in a temperature range that is lower than a temperature range of a subsequent thermal process so that it can shrink under the influence of the subsequent thermal process. The first and second insulating layers 111 and 113 may be formed of an oxide layer, and is preferably a high density plasma (HDP) oxide layer or a polysilazane (PSZ) layer.

Figure 2B:
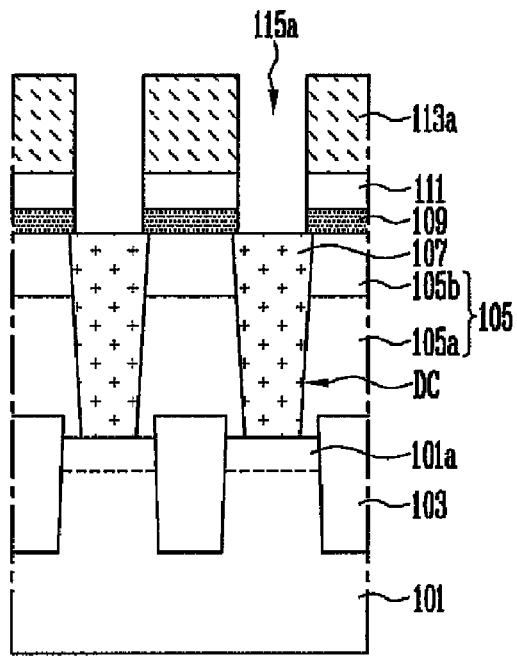

Referring to FIG. 2B, trenches 115a are formed in the second insulating layer 113, the first insulating layer 111, and the etch stop layer 109 by etching the second insulating layer 113, the first insulating layer 111, and the etch stop layer 109. The trenches 115a may be formed according to a pattern so that the drain contact plugs 107 are exposed. The trenches 115a may be formed to have narrow widths in order to secure an overlay margin with the drain contact plugs 107 and formed to have narrower widths than the respective drain contact plugs 107, such that the bottoms of the trenches 115a only expose the respective drain contact plugs 107. For reference, the width of each of the openings of the trenches 115a, formed by etching the second insulating layer 113, is defined as a first width.

Figure 2C:
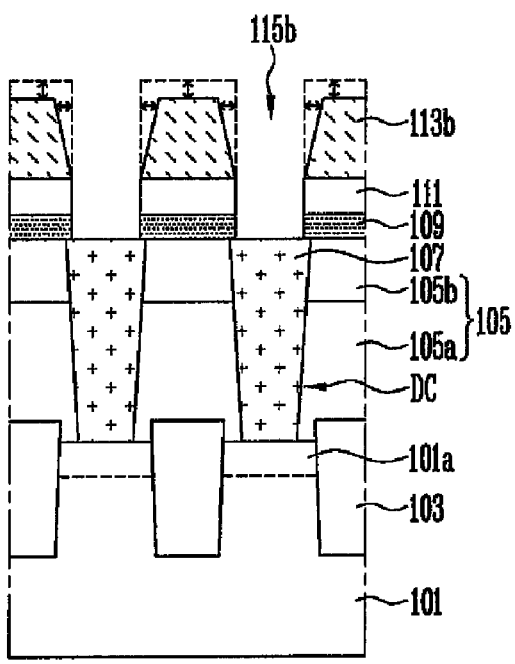

Referring to FIG. 2C, the remaining second insulating layer 113a, remaining after the formation of the trenches 115a, is shrank by performing a thermal treatment process. The trenches 115a and remaining second insulating layer 113a resulting from the thermal treatment process are designated with reference characters '115b' and '113b', respectively. As a result of the thermal treatment process, the first width of each opening of the trenches 115b is changed to a second width, which is wider than the first width by an amount corresponding to the shrinkage of the shrunken second insulating layer 113b. Furthermore, the width of each of the openings of the trenches 115b is greater at the upper end of each of the trenches 115b than at the bottom of the trenches 115b. This is because the first insulating layer 111, defining the bottom of the trenches 115b, does not shrink or shrinks less than the shrunken insulating layer 113b, defining the upper end of the trenches 115b. Thus, each of the openings of the trenches 115b can have a dual damascene structure.

The thermal treatment process may be performed by using a furnace or by heating with plasma. In the thermal treatment process, a process temperature preferably is higher than a deposition temperature of the second insulating layer (113 of FIG. 2A) in order to shrink the second insulating layer, but lower than a deposition temperature of the first insulating layer 111 in order to prevent the first insulating layer 111 from shrinking. For example, the thermal treatment process may be performed at a temperature of 400° C.

Figure 2D:
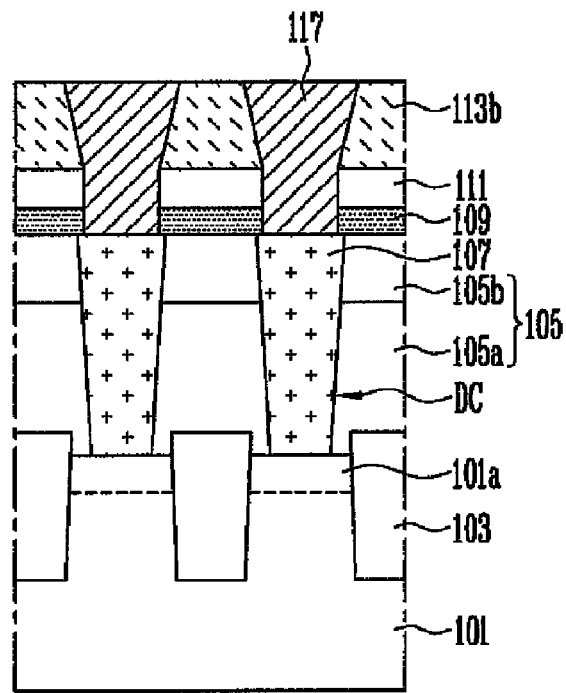

Referring to FIG. 2D, the trenches 115b are filled with a conductive material 117. In the first exemplary embodiment of this disclosure, the width of an opening of the trench 115b is wider at the upper end than at the bottom. Accordingly, in the first exemplary embodiment of this disclosure, gap-filling the entirety of each of the trenches 115b using the conductive material 117 is possible, and thus, the occurrence of a void within the conductive material 117 can be reduced.

The conductive material 117 filling the trenches 115b may be used as metal lines, such as the bit lines of a NAND flash memory device. The conductive material 117 may be made of tungsten (W) or copper (Cu). In a case where copper (Cu) is used as the conductive material 117, a barrier metal may be first deposited in order to prevent the diffusion of copper (Cu) before copper (Cu) is formed. Furthermore, in a case where copper (Cu) is deposited by using an electroplating method, a seed layer for plating copper (Cu) may be formed after a barrier metal is deposited, and then the trenches 115b may be filled with copper (Cu).

As described above, in the first exemplary embodiment of this disclosure, the width of the opening of the trench 115b is widened by utilizing a phenomenon in which the second insulating layer is shrunken by a thermal process. Accordingly, a phenomenon in which an overhang structure is formed in the process of filling the trenches 115b with the conductive material 117 can be improved. Consequently, in the first exemplary embodiment of this disclosure, the generation of a void resulting from the overhang structure can be prevented.

FIGS. 3A to 3D are cross-sectional views illustrating a method of forming metal lines of a semiconductor device according to a second exemplary embodiment of this disclosure.

Figure 3A:
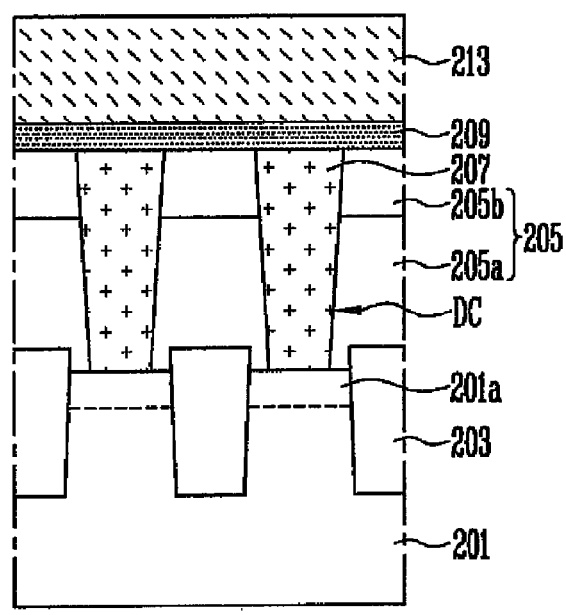
FIGS. 3A to 3D are cross-sectional views illustrating a method of forming metal lines of a semiconductor device according to a second exemplary embodiment of this disclosure.

Referring to FIG. 3A, an etch stop layer 209 is formed over a semiconductor substrate 201 over which underlying structures 201a, 203, 205, and 207 are formed. An insulating layer 213 is formed over the etch stop layer 209.

In the case of a NAND flash memory device, the underlying structures 201a, 203, 205, and 207 may include isolation layers 203, gate patterns (not shown), impurity implantation regions 201a, at least one layer of interlayer dielectric layer 205, contact holes DC, and contact plugs 207.

The etch stop layer 209 may be formed of a nitride layer. The insulating layer 213 is preferably deposited in a temperature range that is lower than a temperature range of a subsequent thermal process so that it can shrink under the influence of the subsequent thermal process. The insulating layer 213 may be formed of an oxide layer, and is preferably a high density plasma (HDP) oxide layer or a polysilazane (PSZ) layer.

Figure 3B:
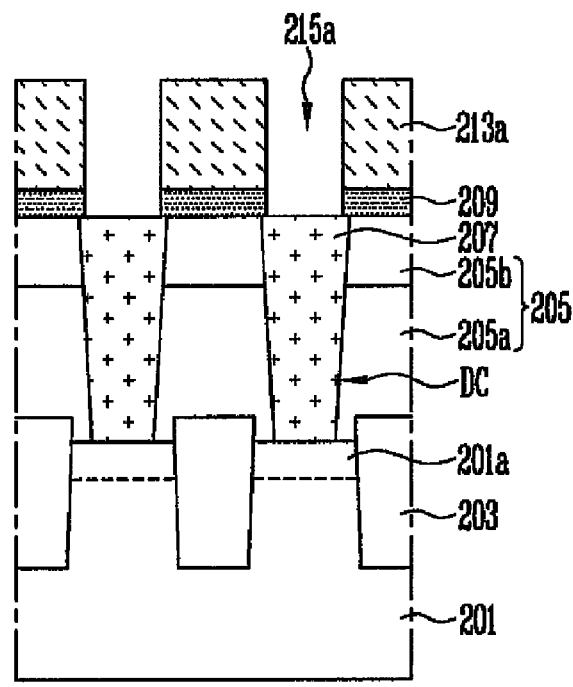

Referring to FIG. 3B, trenches 215a are formed in the insulating layer 213 and the etch stop layer 209 by etching the insulating layer 213 and the etch stop layer 209. The trenches 215a may be formed according to a pattern so that the drain contact plugs 207 used as drain contact plugs are exposed. The trenches 215a may be formed to have narrow widths in order to secure an overlay margin with the contact plugs 207 and formed to have narrower widths than the respective contact plugs 207, such that the bottoms of the trenches 215a only expose the respective drain contact plugs 207. For reference, the width of each of the openings of the trenches 215a is defined as a first width by the remaining insulating layer 213a.

Figure 3C:
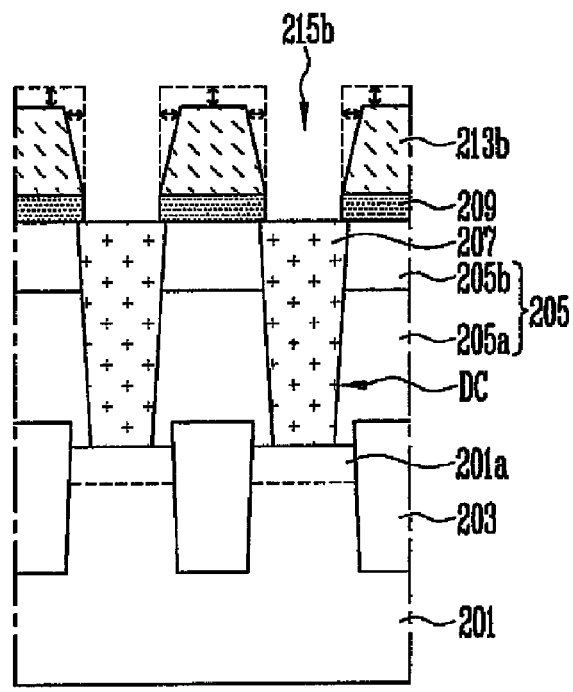

Referring to FIG. 3C, the remaining insulating layer 213a is shrank by performing a thermal treatment process. The trenches 215a and the remaining insulating layer 213a resulting from the thermal treatment process are designated with reference characters '215b' and '213b', respectively. As a result of the thermal treatment process, the first width of each of opening of the trenches 215b is changed to a second width, which is wider than the first width by an amount corresponding to the shrinkage of the shrunken insulating layer 213b. Furthermore, the shrinkage of the insulating layer 213b towards the bottom of the trenches 215b is reduced by the adhesion between the etch stop layer 209 and the insulating layer 213b. In other words, the shrunken insulating layer 213b causes the trenches 115b to have sloping sidewalls because the shrunken insulating layer 213b does not shrink or shrinks less at the boundary of the etch stop layer 209 and the insulating layer 213b. Accordingly, the width of each of the openings of the trenches 215b is greater at the upper end of each of the trenches 215b than at the bottom of the trenches 215b. Thus, each of the openings of the trenches 215b can have a dual damascene structure.

The thermal treatment process may be performed by using a furnace or by heating with plasma. In the thermal treatment process, a process temperature preferably is higher than a deposition temperature of the insulating layer in order to shrink the insulating layer. For example, the thermal treatment process may be performed at a temperature of 400° C.

Figure 3D:
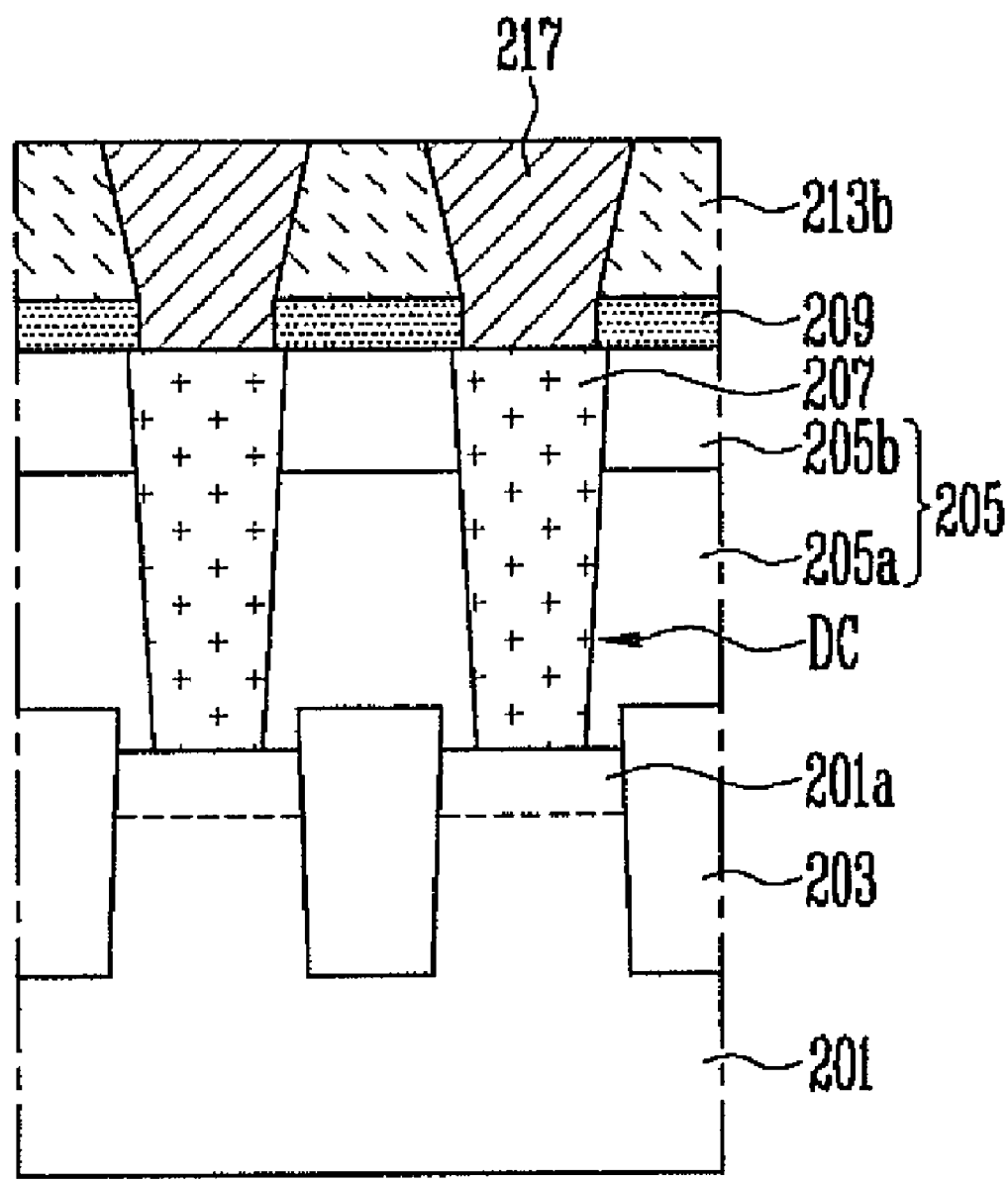

Referring to FIG. 3D, the trenches 215b are filled with a conductive material 217. In the second exemplary embodiment of this disclosure, the width of an opening of the trench 215b is wider at the upper end than at the bottom. Accordingly, in the second exemplary embodiment of this disclosure, gap-filling the entirety of each of the trenches 215b using the conductive material 217 is possible, and thus, the occurrence of a void within the conductive material 217 can be reduced.

The conductive material 217 filling the trenches 215b may be used as the bit lines of a NAND flash memory device and may be formed using the same material and method as that described above with reference to FIG. 2D.

In the second exemplary embodiment of this disclosure, the widths of openings of the trenches 215b are widened by utilizing a phenomenon in which the insulating layer shrinks because of a thermal process. Accordingly, in the process of filling the trenches 215b with the conductive material 217, a phenomenon in which an overhang structure is formed can be improved. Consequently, in the second exemplary embodiment of this disclosure, the generation of a void due to the overhang structure can be prevented.

Although examples in which the trenches are formed in the insulating layer and the metal lines are formed within the trenches have been described, the present disclosure may be applied to a case in which the contact holes are formed in the insulating layer and the contact plugs are formed in the contact holes and also a case in which the recess regions are formed in the insulating layer and the recess regions are filled with the conductive material.

What is claimed is:

1. A method of forming metal lines of a semiconductor device, the method comprising:
    forming an etch stop layer over a semiconductor substrate over which underlying structures are formed; forming an insulating layer over the etch stop layer;
    etching the etch stop layer and the insulating layer to form trenches through which the underlying structures are exposed;
    shrinking the insulating layer by using a thermal treatment process in order to widen openings of the trenches; and
    filling the trenches with a conductive material.

2. The method of claim 1, wherein the insulating layer is formed by depositing an oxide layer at a temperature lower than a temperature of the thermal treatment process.

3. The method of claim 1, wherein the thermal treatment process is performed at a temperature of 400° C.

4. The method of claim 1, wherein the thermal treatment process is performed by using a furnace or heating with plasma.

5. The method of claim 1, wherein the underlying structures comprise:
- impurity implantation regions formed in the semiconductor substrate;
- at least one layer of an interlayer dielectric layer formed over the semiconductor substrate and formed to have contact holes to expose the impurity implantation regions; and
- contact plugs formed within the contact holes and exposed through the trenches.

6. The method of claim 1, wherein the insulating layer is formed of a high density plasma (HDP) oxide layer or a polysilazane (PSZ) layer.

7. The method of claim 1, wherein the etch stop layer is formed of a nitride layer.

8. A method of forming metal lines of a semiconductor device, the method comprising:
- forming a first insulating layer over a semiconductor substrate over which underlying structures are formed;
- forming a second insulating layer over the first insulating layer;
- forming a trench in the second insulating layer and the first insulating layer;
- shrinking the second insulating layer by performing a thermal treatment process in order to widen a width of an opening of the trench; and
- filling the trench with a conductive material.

9. The method of claim 8, wherein the second insulating layer is formed by depositing an oxide layer at a temperature lower than a temperature of the thermal treatment process.

10. The method of claim 8, wherein the thermal treatment process is performed at a temperature of 400° C.

11. The method of claim 8, wherein the first and second insulating layers are formed of a high density plasma (HDP) oxide layer or a polysilazane (PSZ) layer.

12. The method of claim 8, wherein the first insulating layer is formed by depositing an oxide layer at a temperature higher than a temperature of the thermal treatment process.

13. The method of claim 8, wherein the thermal treatment process is performed by using a furnace or heating with plasma.

14. The method of claim 8, wherein the underlying structures comprise:
- an impurity implantation region formed in the semiconductor substrate;
- at least one layer of an interlayer dielectric layer formed over the semiconductor substrate and formed to have a contact hole to expose the impurity implantation region; and
- a contact plug formed within the contact hole.

15. The method of claim 14, wherein the contact plug is exposed through the trench.

* * * * *